United States Patent Office 3,486,934
Patented Dec. 30, 1969

3,486,934

PROCESS FOR THE PRODUCTION OF A METAL-POLYIMIDE COMPOSITE AND THE RESULTING ARTICLE

Herbert M. Bond, Stillwater Township, Washington County, Minn., assignor to Minnesota Mining and Manufacturing Company, St. Paul, Minn., a corporation of Delaware No Drawing. Filed Aug. 1, 1966, Ser. No. 569,066
Int. Cl. B44d *1/18, 1/14*
U.S. Cl. 117—218 13 Claims

ABSTRACT OF THE DISCLOSURE

Polymer-metal composites are shown having a polyimide polymer coating adhered to a metal substrate by an amide-modified polyimide primer.

This invention relates to polymer-metal composites, and more particularly to thin sheets of metal laminated with polyimide polymers.

Coating or lamination of polymers with metal is well known and is a common form of utilization of polymers having good dielectric properties, e.g. for insulation of electrical conductors, resistors and the like. A special use for metal-polymer composites is in the field of electrical circuit boards, wherein a thin copper sheet is laminated with a dielectric sheet, and the composite is used to make electrical circuits, as by the well-known process of etching away unwanted portions, leaving conductor portions in a predetermined pattern upon the surface of the composite.

Coating of polyimides upon copper for insulating purposes has been disclosed in U.S. Letters Patent Nos. 3,168,714; 3,179,634; 3,190,856 and others. While for the purposes disclosed in those patents, the simple coating or laminating of polyimide and electrical conductive sheets was satisfactory, simple laminates of e.g. copper and polyimide have certain disadvantages which render them less suitable for electrical circuit boards or other critical uses than is desired.

One problem with these combinations is the low adherence of the polymer to the metal, thus rendering the insulating sheets easily stripped from the metallic conductors. Another difficulty is movement of the conductor on the sheet during or after etching, which alters the geometry of the components of the etched circuit board relative to the template from which it was produced and hinders alignment of the components of several circuit boards as in superimposed constructions.

In one aspect, this invention contemplates a process for markedly improving the adherence of polyimide films to metals. In another aspect, the invention contemplates provision of electrical circuit boards with improved properties. In another aspect, the invention is embodied in certain highly flexible modified polyimide-metal laminates in which the adherence of the polymer layer to the metal is far greater than that heretofore available. Other objects of the invention will be apparent from the disclosures hereinafter made.

It has now been found that highly improved electrical circuit boards, and other polymer-metal laminates or composites employing polyimides, can be made by coating a linear polymeric amide-modified polyimide-type polymer, in less than fully cured condition, as a primer on the surface of the metallic component prior to application of the coating of the selected polyimide. In its most preferred form, the polyimide is applied to the primed metallic surface in the form of a polyamide-acid or partially imidized polyamide-acid, which is then converted in place together with the primer to a modified polyimide upon the metallic surface.

Amide-modified polyimides of the type which are employed as primers in this invention are described in United States Letters Patent 3,179,635. These polymers are characterized as linear polymeric amide-modified polyimides. They have amide links in the backbone of the polymer and are prepared as disclosed in the above patent or by other methods, as by the reaction of an aromatic carboxylic anhydride-acid, e.g. trimellitic anhydride, and aromatic diamines. In their preparation they form an intermediate polyamide-acid or a partially imidized polyamide-acid or iminolactone polymer stage, which intermediates are soluble in certain solvents such as dimethyl formamide, dimethyl acetamide and the like. The intermediate stage polymer is curable to the polyamide-imide form by heat or chemical dehydration.

Even when partially cured, the amide-acid stage of these amide-modified polymers retains solubility in useful solvents, and partially imidized polymers of this type can be used in this invention. While in some cases commercially available solutions of amide-acid polymers of this type may contain few or none of the ultimate imide groups, it is believed that commonly at least about 15 percent of the nitrogen atoms present are in the form of imide groups; imide group contents of as much as 33 percent or somewhat more in the polymers yield useful results as primers for the invention.

The polyimides employed as the film-forming coatings in the composites of the invention are those of the type described in U.S. Letters Patent Nos. 3,179,634 and 3,179,633. These polymers have an intermediate polyamide-acid stage in which they are soluble in certain solvents and can thus be fabricated. Polyamide-acids of the type which are employed herein, and which are intermediates in the preparation of the said polyimides, are more fully described in U.S. Letters Patent No. 3,179,614. These polyamide-acids are likewise conveniently cured by heating, although chemical curing methods are also known.

Broadly speaking, in carrying out the method of the invention, a metallic surface, for example a copper sheet which may be of the order of 0.5 to 10 mils or greater in thickness, is first cleaned to remove greasy or oxide films from the surface. The surface may then be roughened if desired, as by etching with a chemical etching solution, the solution and any etching residue removed, and the sheet dried. The prepared metal sheet is then treated with a priming coat of the intermediate stage of the selected polyamide-imide polymer, e.g. a polyamide-acid type polymer, ordinarily dissolved in a suitable organic solvent for the polymer. Partially imidized, but still soluble, intermediate stage amide-modified polymers can also be used. Such primer coating solutions can be brushed, sprayed or knife coated upon the surface, and the method of coating of course is not critical. The important consideration is to obtain a substantially uniform primer coating over the entire surface, usually to a wet film thickness which, when dried, leaves a surface film of about 0.1 to 0.5 mil in thickness. It will be appreciated that various factors influence the wet thickness of the film, such as solids concentration in the solution, viscosity of the polymer, etc. Variations are readily determined and compensated for by empirical methods. The coated surface is dried to remove the solvent, and a mild heat treatment may be used to effect partial curing, which assists in obtaining good anchorage. Partial cure also tends to prevent any removal of primer by the follow-on coating step.

The solution of the polyamide-acid or other intermediate stage polymer for forming the selected polyimide coating is then coated over the primer layer. Again, any convenient method of coating, such as knife coating, spraying or the like can be used. The wet film thickness of this coating is generally greater than that of the primer layer by a factor of 3 or more, but the thickness of the polyamide-acid layer is regulated by the final thickness of polyimide layer which is desired. For the purposes of the invention, it is only preferred that the final polyimide layer at least be self-supporting, e.g. if the metal is to be removed as by etching. A dry thickness of about 0.15 to upwards of 4.5 mils is preferred.

The intermediate stage polymer coatings are then cured, preferably by heating, whereupon the intermediate stage of primer and top coating are converted to modified polyimide polymer, or dielectric layer, of the resulting composite. The primer and the polyimide layer are unified by the curing, to form an integral dielectric layer which is strongly adhered to the metal. This result seems to indicate that the primer is incorporated, at least partially, into the polyimide to form a modified polyimide coating or lamina.

The composites formed according to the invention are very flexible and strong, and the polymer is tightly adherent to the metal. When the unwanted metal is removed as by etching, the films which remain are flexible, and strong, and the remaining metal is also tightly adhered. Shrinkage on etching is relatively small. Instead of forming a modified polyimide dielectric layer upon only one side of the metallic substrate to form the composite, the modified polyimide layer can be placed on both sides of the metallic sheet, e.g. after etching to form a printed circuit.

Compared with polyimide films formed directly upon the surface of cleaned copper, coatings prepared using the technique of the present invention are found to be from 2 to more than 25 times more tightly adherent to the metallic surface. Attempted separation of the layers, as by peeling, generally causes at least partial disruption of the polymeric layer. In some cases there is failure or disruption of the metallic substrate, e.g. where soft metals such as copper are used. Apparently, although this theory is not to be considered binding as to the actual mechanism, the metal and the coatings of primer and polyimide film are bound together by some kind of chemical interreaction.

Any metallic surface can be coated with the method of the invention, and the modified polyimide film dielectric layer will be found to be more adherent than when the polyimide alone is used for coatings, without the primer. Metallic sheets or foils which have been found to be particularly useful for the purposes of the invention, e.g. for production of electrical circuit boards, cables and similar devices, are copper, silver and nickel-chromium alloy, e.g. Nichrome. (Nichrome is the trade name for a high melting point alloy of 60 percent nickel, 25 percent iron and 15 percent chromium; or 80 percent nickel and 20 percent chromium, used in electrical resistance devices.)

The peel strength of laminates produced in the invention can be measured by the following method which is a modification of ASTM D-1867: Components for making printed circuit elements are provided with a resist photographically printed in the usual way and then etched so that copper strips 1/32" wide remain. After removal of the resist material, the composite is mounted in an Instron testing machine in such a way that the copper strip is peeled back from the polyimide film at an angle of 180°. Results are measured in lbs./inch, the actual values obtained being, in this case, multiplied by 32. Tests on various materials show that peel strength up to 9 lbs./inch can be measured in this way; above 9 lbs./inch the copper fails.

While the laminates of the invention have been described with respect to uses as flexible circuit boards, they are not so limited, since the process can be employed to produce a strongly adherent, abrasion resistant insulating coating for e.g. copper wires, ribbon and the like, as well as heat-resistant coatings for resistors or heating elements, e.g. heating panels and the like.

The following examples, in which all parts are by weight unless otherwise specified, will more particularly illustrate the invention and the novel embodiments thereof. These examples are not to be construed as limiting the scope of the invention in any way.

Example 1

Copper foil produced by the electrolytic process was coated as follows: The one ounce (one ounce per square foot) foil, approximately 1.6 mils in thickness, was treated with acidic ammonium persulfate solution to clean the surfaces. Owing to the electrolytic method of production, the foil has a roughened surface upon one side.

A polyamide-imide polymer, the monomeric components of which were trimellitic anhydride and methylene dianiline, was dissolved in dimethyl acetamide to 30 percent solids. The solution had bulk viscosity of 600 cp. at 23° C. The polymer is available commercially under the trademark "Amoco" AI-Type 10. The solution of polyamide-imide was applied to the roughened surface of copper sheet, using a Meyer bar with 9 mil wire to form a wet film 3 mils thick. The coated copper was placed in a 93° C. forced air oven for 15 minutes. When removed, the thin primer film thus produced was dry to the touch, and approximately 0.2 mil thick. The film was still soluble in dimethyl acetamide, indicating that it was not completely cured.

A polyamide-acid solution was prepared from a mixture of equimolar amounts of pyromellitic dianhydride and 4,4'-diamino-diphenyl ether, in dimethyl acetamide. Polymerization was continued until bulk viscosity of the solution was 23,000 cp. at 23° C. The inherent viscosity of the polymer was 1.64, concentration 0.5 g. per 100 ml., solvent dimethyl acetamide, at 23° C. To facilitate spreading, 0.25 percent of a flow control agent consisting of a silicone fluid (available commercially under the trademark "Union Carbide L-520") was added to this solution. The final solids content of this solution was 15 percent. The polyamide-acid solution was applied to the primed copper surface using a knife applicator, the wet film coating thus produced being 12 mils in thickness. The thus-coated composite was dried and cured in a forced air oven according to the following schedule:

15 minutes—82° C.
15 minutes—93° C.
5 minutes at each of 104, 132, 154, 177, 205, 232, 260 and 288° C.

After removing from the oven, it was found that the cured composite had a clear, hard and tough film strongly adhered to the copper surface. The uncoated surface of the copper was dark owing to oxidation during curing. This dark residue could be removed from the surface by quickly dipping the composite, e.g. for about 15 seconds, into a solution having the following composition:

| | | |
|---|---|---|
| $(NH_4)_2S_2O_8$ | grams | 2000 |
| $H_2O$ | liters | 8 |
| Concentrated $H_2SO_4$ | ml | 100 |
| 10% $HgCl_2$ solution | drops | 20 |

This cleaning solution is essentially acidic ammonium persulfate.

After cleaning, the copper composite is washed with water, and dried. The composite can be further treated to keep the surface bright and clean during storage, if desired. Commonly used agents for this purpose include sodium pyrophosphate and light oil, inhibitors, etc. in suitable aqueous or nonaqueous solvents.

The copper surface of the composite was clean and bright in appearance, and the coated side had a film of modified polyimide dielectric layer approximately 1 mil in thickness.

The composite was tested to determine the peel strength. It was found that the polyimide film was not separable from the copper sheet without destroying either the copper sheet or the film. Based on previous test results, this indicates a peel strength over 9 lbs. per inch width.

The copper foil was etched away from the composite, using aqueous ferric chloride solution, and the remaining film, a strong, flexible self-supporting clear amber-colored sheet about 1 mil in thickness, was tested using standard test methods to determine tensile modulus, tensile strength and elongation. The results are shown in the following table.

TABLE I

| Test | Temperature | | | |
|---|---|---|---|---|
| | −40° C. | 23° C. | 150° C. | 300° C. |
| Tensile Modulus, p.s.i. | $3.8\times10^5$ | $2.8\times10^5$ | $1.7\times10^5$ | $1.0\times10$ |
| Tensile Strength, p.s.i. | $1.6\times10^4$ | $1.3\times10^4$ | $9.2\times10^3$ | $4.7\times10^3$ |
| Elongation (percent) | 18 | 18 | 21 | 65 |

The electrical properties of this film, determined by standard methods, are shown in the following table.

TABLE II

| | −40° C. | 23° C. | 150° C. | 200° C. |
|---|---|---|---|---|
| 100 cycles: | | | | |
| K | 3.55 | 3.56 | 3.57 | 3.55 |
| $D_x\times10^2$ | 0.25 | 0.20 | 0.34 | 1.07 |
| 100 kilocycles: g | | | | |
| K | 3.50 | 3.51 | 3.51 | 3.45 |
| $D_x\times10^2$ | 0.26 | 0.32 | 0.35 | 0.32 |

K=dielectric constant.
$D_x$=dissipation factor.

Example 2

The same procedure was followed as in Example 1, except that the smooth side of the copper foil was coated. Wet film thickness of the primer was 3 mils, and wet film thickness of the polyamide-acid solution was 12 mils. After curing and cleaning, a foil with bright exposed copper surface and tightly adherent, transparent polyimide film coating was obtained. The measured peel strength was about 0.5 pound per inch.

Example 3

For purposes of comparison, sheets of one ounce copper foil were coated with poly bis(4-aminophenyl)ether pyromellitimide by the same procedure as in Examples 1 and 2, respectively, except that the priming coating of the amide-imide polymer was omitted in each case. The cured composites after cleaning and drying were tested for peel strength. The results obtained are shown in Table III, together with the peel strength of the film on copper foil primed with amide-imide polymer.

TABLE III.—PEEL STRENGTH

| | Rough side of copper | Smooth side of copper |
|---|---|---|
| Without amide-imide prime coat (lb./inch) | 0.2 | 0.2 |
| With amide-imide prime coat (lbs./inch) | >9 | 0.4 |

Example 4

A one ounce electrolytic copper sheet, as in Example 1, was used as a substrate for the composite. The sheet was dip-coated so that the rough surface received a wet film about 7 mils in thickness of a solution in dimethyl acetamide of an amide-imide polymer made from pyromellitic dianhydride and 3,4'-diaminobenzanilide. Solids content of the solution was about 16.5 percent. This coating was dried in an oven at 93° C., and thereafter a polyamide-acid solution as described in Example 1 was knife coated over the primed surface, so that the thickness of the wet film was 15 mils. The composite was cured and cleaned as in Example 1. The composite had a bright, uncoated copper surface and a rather dark film surface. The peel strength of the composite was about 1.5 pounds per inch.

Example 5

A sheet of two-ounce electrolytic copper foil, approximately 3.2 mils in thickness, was coated according to the procedure and using the same primer and top coating as in Example 1. However, the wet film thickness of the polyamide-acid top coating was made to be 24 mils. After curing, the composite was found to have a polyimide film about 2.0 mils in thickness. In attempting to determine the peel strength, it was found that the polymer could not be separated from the copper without destroying the polymer. This indicates that the composite had a peel strength well in excess of 9 pounds per inch.

Example 6

A sheet of ½ ounce (0.8 mil) electrolytic copper foil was coated according to the procedure of Example 1. However, the wet thickness of polyamic acid solution was reduced to 7 mils. After curing, the composite had a polyimide coating approximately 0.5 mil in thickness. Upon determination of peel strength, it was found that the polymeric film could not be separated from the copper sheet without destroying the film.

Example 7

A sheet of smooth Nichrome (80 percent nickel-20 percent chromium alloy) 1.0 mil in thickness was cleaned by dipping the foil into a 45 percent aqueous ferric chloride solution for 20 seconds, followed by an immediate water wash and hot air drying. A solution in dimethyl acetamide of a polyamide-modified polyimide formed from trimellitic anhydride and methylene dianiline, the solids content of the solution being 30 percent, was coated on the roughened surface of the nickel-chromium alloy foil in a thickness of 3 mils. The sheet was then dried for 15 minutes at 93° C. in a forced air oven. The resulting film was dry to the touch. The dimethyl acetamide solution of polyamide-acid prepared from a mixture of pyromellic dianhydride and 4,4'-diaminodiphenyl ether which was used in Example 1 was then knife coated over the amide-imide film on the nickel-chromium alloy surface, the wet film thickness being 7 mils. The composite was then subjected to curing under the conditions of time and temperature set forth in Example 1. It was not necessary to clean the cured composite. The thickness of the polyimide film of the cured composite was 0.5 mil.

The peel strength determination was very difficult because of the extremely strong adherence of the film to the nickel-chromium alloy sheet. Either the metal foil or the polymer film was destroyed when separation of the two was attempted. An estimate of about 4–9 pounds per inch peel strength could be made.

Example 8

A sheet of one ounce electrolytic copper foil pretreated as set out in Example 1 was coated on the rough side to a wet thickness of 7 mils with a polyamide-imide polymer prepared from pyromellitic dianhydride and 3,4'-diaminobenzanilide. The polymer was received as a solution in dimethyl acetamide and can be obtained under the trademark designation "AI–8." The so-primed copper sheet was dried for ½ hour at 93° C. Over this sheet was coated a 10 percent solids solution in dimethyl acetamide of the polyamide-acid from oxydianiline and pyromellitic dianhydride. The wet thickness of the film was 15 mils. This composite was dried for one hour at 93° C., one hour at 150° C., one hour at 260° C. and one hour at 315° C. The finished composite was a flexible sheet, the thickness of the polymer coating being approximately 1.1 mils. The bond strength of the polymer to the copper was found to be 1.4 pounds per inch.

Example 9

Composite copper foil-modified polyimide dielectric laminates were prepared as set forth in Example 1. Several sheets of such composites were laminated in superimposed relationship as follows: (Lamination can be carried out on the sheets as produced, or after an electrical circuit in desired form is produced by the known process of coating the copper surface with a photosensitive resist, exposing the resist of actinic light through a photographic negative provided with the pattern to be reproduced, removing portions of the resist not affected by light, etching the copper away from the dielectric film in the thus exposed areas and removing the remainder of the resist material.)

The dielectric film side of at least one of the sheets is knife-coated with a thin coating of a pressure-sensitive adhesive in a 40 percent solids solution. The solvent is a mixture of ethylacetate and toluene, and the adhesive is a mixture of base polymers consisting of alkyl acrylates and acrylic acid and acrylate-modified vinyl acetate polymers, an organic crosslinker, and a heat activated crosslinking catalyst. The solvent is removed from the adhesive layer on the film by heating at about 80° C. for about 5 minutes. The film sides of two sheets, one of which is coated with the adhesive, are then brought together between two nip rolls. One roll, made of metal, is heated to a surface temperature of about 150° C.; the other roll, of silicon rubber, is unheated. The rolls are pressed together with a force of about 220 lbs./sq. inch, and the speed of lamination is about 6 inches per minute.

The resulting sandwich construction was strong and free from blisters. The laminate was separated at the adhesive bond only with great difficulty.

Example 10

Long strips of a composite of one ounce electrolytic copper foil and modified polyimide dielectric were produced as described in Example 1. This composite was formed into a strip cable containing several wires as follows:

Strips of pressure-sensitive vinyl tape (e.g. of the type used for electrical insulation purposes) of the desired width, e.g. ½ inch, were applied to the cleaned copper side of the composite so that the strips were parallel to and ⅛ inch away from the edge of the composite and to each other, and about ⅛ inch apart. In this way, three conductors are formed on a two inch wide strip of composite. The assembly was placed in an aerated etching solution having the same composition as that employed in Example 1 for cleaning purposes. After 30 minutes in the etching bath, the copper where not protected by the vinyl tape was completely etched away. The vinyl tape was then removed, and the composite having copper strips on a self-supporting modified polyimide film was replaced in the aerated etching solution for three minutes, then washed with tap water and dried. The surface of the remaining strips was roughened by etching in this way and was similar in appearance to the rough surface of electrolytic copper foil. After drying, the remaining copper strips and composite surface were coated with amide-modified polyimide primer and the polyamide-acid solution in the same way as in the production of the original composite, so as to form a continuous dielectric coating in which the copper strips are embedded. The coating was dried according to the time and temperature schedule set forth in Example 1.

The strip of cable thus produced was examined under a microscope and found to be free from delamination or blisters. The second coating of modified polyimide was found to be strongly adherent both to the initial modified polyimide dielectric layer and to the copper strips. The composite thus produced way very flexible and strong, and there was a continuous insulating coating over the conductors.

Other dielectric materials can be employed to coat the conductors which are formed in making cables as set forth above. Thus, for example, after copper conductor strips have been formed, as set forth above, a sheet or strip of irradiated polyethylene cut to fit over the entire area of the modified polyimide dielectric film is laminated to the composite. Irradiated polyethylene consisting of 100 parts of low density polyethylene (available under the trademark designation "DYNH"), 10 parts of synthetic rubber ("GRS–1011"), 0.15 part of an antioxidant (e.g. "Akroflex C") and 2 parts of carbon black ("Carboloc No. 2"), irradiated to a sol fraction of 0.34, film thickness 7 mils, was used. The polyethylene was disposed over the surface of the composite so as to contact the copper and film surfaces. A Carver press was employed to press the polyethylene and the composite having the copper conductors together, for about 5 minutes at a temperature of about 150° C. and at a pressure of about 1500 p.s.i.g. The press was cooled and the laminate removed. The polyethylene was firmly bonded to the composite without air entrapment, and the polyethylene portion of the laminate could be peeled away only with difficulty.

In the same way, a sheet of polytetrafluoroethylene ("Teflon FEP") was used in place of the polyethylene. The polytetrafluoroethylene film was 2 mils in thickness, and the assembly was pressed at about 310° C. for five minutes at 30 p.s.i.g. After cooling, the laminate was removed and it was found that the polytetrafluoroethylene was tightly adhered to both the copper and the exposed portion of the modified polyimide dielectric substrate.

When desired, pigments or other additives can be incorporated in the solutions of primer or polyamic acid intermediate stage resin, e.g., to impart color for coding purposes or to alter the dielectric or other properties of the modified polyimide film layers.

What is claimed is:

1. A polyimide-metal composite sheet comprising a metal substrate and a combined and unified amide-modified primer and a polyimide coating thereover forming a dielectric layer on said substrate, said polyimide primer and polyimide coating being unified upon said substrate by simultaneously completing curing of the corresponding intermediate-stage-polymers for said polyimides; said dielectric layer being of sufficient thickness to provide a self-supporting film when said metallic substrate is removed, as by etching.

2. A composite according to claim 1, wherein the polimide is poly bis(4-aminophenyl)ether pyromellitimide.

3. A composite according to claim 2, wherein the metallic substrate is copper.

4. A composite according to claim 1, wherein the metallic substrate is copper.

5. A laminated metal-polyimide composite according to claim 1, comprising superimposed and adhered layers of dielectric-conductive metal composite sheets, the metallic portions thereof adapted to form electrical circuit elements and the dielectric portions thereof being comprised of self-supporting films of combined and unified amide-modified primer and polyimide coating thereover, and being strongly adherent to the metallic portions of said composite sheets so that attempted separation by mechanical peeling causes at least partial disruption of a polymeric portion of said composite.

6. A laminated metal-polyimide composite according to claim 5, wherein the polyimide portion of the self-supporting film is poly bis(4-aminophenyl)ether pyromellitimide.

7. An insulated electrical cable comprising at least one electrically conductive metallic strip enclosed by a dielectric material comprising combined and unified amide-modified polyimide primer and a polyimide coating thereover, said polyimide primer and polyimide coating being unified upon said metallic strip by simultaneously completing curing of the corresponding intermediate-stage-polymers for said polyimides; the polymeric portion of said cable forming a strong, flexible dielectric film which is self-supporting and strongly adherent to said metal so that attempted separation by mechanical peeling causes at least partial disruption of a polymeric layer of said cable.

8. A cable according to claim 7, wherein the polyimide is poly bis(4-aminophenyl)ether pyromellitimide and the metal is copper.

9. A dielectrically insulated electrical conductor comprising at least one elongated metallic conductor adherent to a substrate comprised of a dielectric material comprising combined and unified amide-modified polyimide primer and a polyimide coating thereover, said polyimide primer and polyimide coating being unified upon said metallic conductor by simultaneously completing curing of the corresponding intermediate-stage-polymers for said polyimides; the insulation of said metallic conductor being completed by a second and different polymeric dielectric, the polymeric portion of said electrical conductor forming a strong, flexible, self-supporting dielectric coating which is strongly adherent to said metal so that attempted separation by mechanical peeling causes at least partial disruption of a polymeric portion of said coating.

10. A conductor according to claim 9, wherein the polyimide portion of the substrate is poly bis(4-aminophenyl)ether pyromellitimide and the metal is copper.

11. A conductor according to claim 10, wherein the second polymeric dielectric is polytetrafluoroethylene.

12. A conductor according to claim 10, wherein the second polymeric dielectric is polyethylene.

13. A process for the production of a metal-polyimide composite comprising (1) coating a clean metallic substrate with a primer coating of a polyamide-modified polyamide-acid polymer; (2) drying said primer coating; (3) coating the primed substrate with a layer of film-forming polyamide-acid polymer and (4) simultaneously curing said primer coating and said layer of polyamide-acid by heating at a temperature sufficient to convert the polyamide-acid polymers to polyimide polymers.

References Cited

UNITED STATES PATENTS

| | | | |
|---|---|---|---|
| 3,105,775 | 10/1963 | Lavin et al. | 117—218 X |
| 3,168,417 | 2/1965 | Smith et al. | 117—218 X |
| 3,179,635 | 4/1965 | Frost et al. | 260—78 |
| 3,190,770 | 6/1965 | Lavin et al. | 117—75 X |
| 3,306,771 | 2/1967 | Schmidt et al. | 117—218 |
| 3,442,703 | 5/1969 | Naselow | 117—218 |

WILLIAM D. MARTIN, Primary Examiner

D. COHEN, Assistant Examiner

U.S. Cl. X.R.

117—75, 161

PO-1050
(5/69)

UNITED STATES PATENT OFFICE
CERTIFICATE OF CORRECTION

Patent No. 3,486,934 Dated December 30, 1969

Inventor(s) Herbert M. Bond

It is certified that error appears in the above-identified patent and that said Letters Patent are hereby corrected as shown below:

Column 5, line 17, "1.0 x 10" should read --1.0 x $10^5$--; line 28, "-g" should be deleted. Column 8, line 47, "claim 2" should read --claim 1--;

SIGNED AND
SEALED
SEP 15 1970

(SEAL)
Attest:

Edward M. Fletcher, Jr.
Attesting Officer

WILLIAM E. SCHUYLER, JR.
Commissioner of Patents